United States Patent
Lam et al.

(10) Patent No.: US 9,252,024 B2
(45) Date of Patent: Feb. 2, 2016

(54) DEPOSITION CHAMBERS WITH UV TREATMENT AND METHODS OF USE

(71) Applicant: Applied Materials, Inc., Santa Clara, CA (US)

(72) Inventors: Hyman Lam, San Jose, CA (US); Nicholas R. Denny, Santa Clara, CA (US); Joseph AuBuchon, San Jose, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 134 days.

(21) Appl. No.: 13/897,327

(22) Filed: May 17, 2013

(65) Prior Publication Data

US 2014/0342555 A1 Nov. 20, 2014

(51) Int. Cl.
| | |
|---|---|
| *C23C 16/00* | (2006.01) |
| *H01L 21/3205* | (2006.01) |
| *C23C 16/48* | (2006.01) |
| *H01L 21/67* | (2006.01) |
| *H01L 21/768* | (2006.01) |

(52) U.S. Cl.
CPC ........ *H01L 21/32051* (2013.01); *C23C 16/482* (2013.01); *H01L 21/67115* (2013.01); *H01L 21/76862* (2013.01)

(58) Field of Classification Search
CPC .......................... C23C 16/481–16/488; C23C 16/455–16/45597; H01L 21/67115
See application file for complete search history.

(56) References Cited

U.S. PATENT DOCUMENTS

| | | | | |
|---|---|---|---|---|
| 4,800,105 | A * | 1/1989 | Nakayama et al. | 427/253 |
| 6,015,503 | A | 1/2000 | Butterbaugh et al. | |
| 6,301,434 | B1 * | 10/2001 | McDiarmid | C23C 16/4404 118/724 |
| 2007/0218704 | A1 | 9/2007 | Ishizaka et al. | |
| 2007/0256635 | A1 * | 11/2007 | Bour et al. | 118/715 |
| 2008/0127895 | A1 * | 6/2008 | Shao et al. | 118/725 |
| 2010/0055342 | A1 | 3/2010 | Chiang et al. | |
| 2012/0090691 | A1 | 4/2012 | Baluja et al. | |
| 2012/0132618 | A1 | 5/2012 | Baluja et al. | |
| 2012/0258259 | A1 | 10/2012 | Bansal et al. | |
| 2014/0053866 | A1 * | 2/2014 | Baluja et al. | 134/1.1 |

FOREIGN PATENT DOCUMENTS

JP 2007-227691 9/2007

OTHER PUBLICATIONS

PCT International Search Report and Written Opinion in PCT/US2014/038174, mailed Sep. 30, 2014, 12 pages.

* cited by examiner

*Primary Examiner* — Gordon R Baldwin
*Assistant Examiner* — Charlee Bennett
(74) *Attorney, Agent, or Firm* — Servilla Whitney LLC

(57) ABSTRACT

Described are apparatus and methods for processing semiconductor wafers so that a film can be deposited on the wafer and the film can be UV treated without the need to move the wafer to a separate location for treatment. The apparatus and methods include a window which is isolated from the reactive gases by a flow of an inert gas.

16 Claims, 3 Drawing Sheets

DEPOSITION CHAMBERS WITH UV TREATMENT AND METHODS OF USE

BACKGROUND

Embodiments of the invention generally relate to apparatus and methods for depositing a film on a substrate surface and treating the film with UV radiation. In particular, embodiments of the invention are directed to apparatus and methods incorporating a window through which UV radiation can be directed toward the substrate surface while minimizing deposition on the window.

Metal films (e.g., ruthenium) can be deposited by cyclical deposition processes. For example, a substrate can be exposed to a ruthenium organometallic precursor which adsorbs to the surface of the substrate. The organometallic bonds can be broken to drive off the organic portion, leaving a metal film on the substrate surface. The organometallic complex can be decomposed or reduced to the bare metal by, for example, exposure to ultraviolet light. However, the films generally have a significant amount of organic contaminants, resulting in a poor quality metal film.

Additionally, apparatus for this process use a window to separate the reaction space of the processing chamber from the light source. This window can be coated with contaminants, reducing the transparency of the window and decreasing the efficiency of the process. The window may need to be frequently cleaned or replaced, resulting in significant downtime and expose.

Therefore, there is a need in the art for methods and apparatus capable of depositing good quality metal films using light exposure while minimizing downtime associated with cleaning and/or replacement of the window which isolates the light source from the reaction space.

SUMMARY

One or more embodiments of the invention are directed to apparatus for depositing a film on a substrate. The apparatus comprises a processing chamber, a rotatable pedestal, a reactive gas injector, a purge gas injector and a UV source. The processing chamber has a body including walls, a bottom and a top. The rotatable pedestal is positioned within the processing chamber to support a substrate. The rotatable pedestal has a top surface defining a lower boundary of a processing volume. The reactive gas injector supplies a reactive gas into the processing volume of the processing chamber. The reactive gas injector is in fluid communication with a reactive gas source. The purge gas showerhead is positioned above the pedestal and is substantially transparent to UV radiation in a predetermined wavelength range and in fluid communication with a purge gas. The UV source positioned above the purge gas showerhead to direct UV radiation within the predetermined wavelength range through the purge gas showerhead toward the processing volume.

In some embodiments, the reactive gas injector comprises a deposition showerhead positioned between the purge gas showerhead and the pedestal, the deposition showerhead allows UV radiation to pass to the processing volume. In one or more embodiments, the deposition showerhead is positioned a distance from the purge gas showerhead, the distance defining a gas plenum. In some embodiments, the gas plenum is in fluid communication with one or more of a reactive gas source and a purge gas source. In one or more embodiments, the gas plenum comprises at least one wall to separate the plenum into sections, each section in fluid communication with a reactive gas. In some embodiments, there are at least two different reactive gases. In one or more embodiments, the UV source is positioned over one of the sections. In some embodiments, there is one wall splitting the gas plenum into two sections, each section in fluid communication with a different reactive gas.

In one or more embodiments, the deposition showerhead comprises quartz.

In some embodiments, the deposition showerhead comprises a quartz plate with a plurality of openings to allow a flow of gas and UV radiation to pass through.

In one or more embodiments, the reactive gas injector comprises at least one injector port positioned to provide a flow of gas substantially parallel to the top surface of the pedestal. In some embodiments, comprise a plurality of injector ports separated into at least one first reactive gas port and at least one second reactive gas port, the at least one first reactive gas port in fluid communication with a first reactive gas and the at least one second reactive gas port in fluid communication with a second reactive gas.

In some embodiments, the UV source is positioned to expose the entire pedestal to UV radiation simultaneously. In one or more embodiments, the UV source comprises a plurality of lamps.

Additional embodiments of the invention are directed to methods of depositing a film on a substrate. A substrate is placed into the processing chamber. The substrate is exposed to a reactive species to deposit a film on the substrate. UV radiation is directed toward the deposited film on the substrate through a substantially transparent purge gas showerhead for a predetermined time. A purge gas stream is provided through the substantially transparent purge gas showerhead toward the substrate to prevent deposition of the reactive species on the substantially transparent purge gas showerhead. Repeating steps to deposit a film of a desired thickness on the substrate.

In some embodiments, the film is deposited by one or more of a CVD and an ALD process.

In one or more embodiments, exposing the substrate to the reactive species comprises flowing one or more reactive gas into the processing chamber through a deposition showerhead positioned between the substrate and the substantially transparent purge gas showerhead. In some embodiments, a plenum is formed between the deposition showerhead and the substantially transparent purge gas showerhead, the plenum having at least one separate section to contain the reactive gas and the purge gas flowing from the substantially transparent purge gas showerhead. In one or more embodiments, the plenum holds and separates at least two different reactive gases which are flowed into separate sections of the processing chamber so that there is substantially no mixing of the reactive gases and the method further comprises rotating the substrate within the processing chamber. In some embodiments, exposing the substrate to the reactive species comprises flowing one or more reactive gas into the processing chamber through a gas injector in a side of the processing chamber.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

FIG. 1 shows a partial cross-sectional schematic view of a processing chamber in accordance with one or more embodiment of the invention.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the invention are directed to apparatus and methods for depositing and UV treating a film.

As used in this specification and the appended claims, the terms "wafer", "substrate" and the like are used interchangeably. In some embodiments, the wafer is a rigid, discrete material. When discussing the deposition of a film on the substrate surface, those skilled in the art will understand that the film can be formed directly on the bare substrate surface, or on a layer present on the substrate surface. Additionally, deposition on a substrate can mean the entire substrate surface or merely a portion of the substrate surface.

As used in this specification and the appended claims, the terms "reactive gas", "reactive precursor", "first precursor", "second precursor" and the like, refer to gases and gaseous species capable of reacting with, or adsorbing onto, a substrate surface or a layer on the substrate surface.

Embodiments of the invention are directed to apparatus and methods for depositing a metal film. In some embodiments, an atomic layer deposition (ALD) process that employs a cyclic process of precursor deposition and UV treatment produces a film from a metal organic precursor. Ultraviolet treatment can be used to break the metal organic bond resulting in a metal film having lower organic contamination. Ultraviolet light is capable of breaking multiple bonds per ligand regardless of the hapticity.

Some embodiments of the invention are directed to hardware configurations that enable an ALD process using cyclic precursor exposure and UV treatment in a single chamber. Some embodiments have both a UV and has showerhead. Some embodiments, have a UV light source with side gas injection. Some embodiments have a UV light source with a rotating pedestal.

Figure 1:
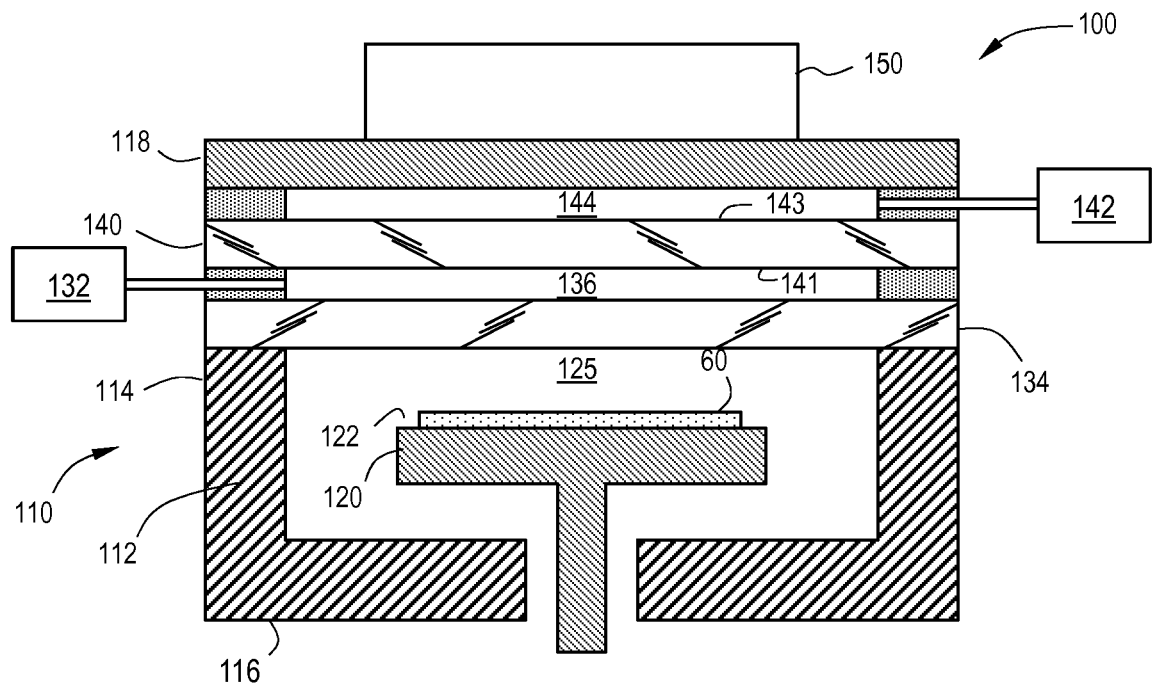

FIG. 1 shows an apparatus in accordance with one or more embodiments of the invention. The apparatus 100 includes a processing chamber 110 having a body 112 including walls 114, a bottom 116 and a top 118. A pedestal 120 is positioned within the processing chamber 110 and is suitable for supporting a substrate 160 during processing. The pedestal 120 of some embodiments can rotate so that the substrate 160 supported thereon is also rotating. Rotation of the substrate during processing may be desirable to increase the uniformity of the film being grown. The pedestal 120 has a top surface 122 which supports the substrate 160. The top surface may have a recess (not shown) to prevent the substrate 160 from moving laterally during processing.

The processing chamber 110 includes a processing volume 125. The processing volume 125 is the region where reactive species are able to react with/adsorb onto the substrate surface. The lower boundary of the process volume 125 is defined by the top surface 122 of the pedestal 120. It will be understood by those skilled in the art that the processing volume 125 can extend any part of the processing chamber, but that the portion above the substrate is the most likely to interact with the substrate.

A purge gas showerhead 140 acts as a window between a UV source 150 and the processing volume 125. The purge gas showerhead 140 includes a front face 141 facing the processing volume 125 and a back face 143 facing the UV source 150. The purge gas showerhead 140 is positioned above the pedestal 120. The purge gas showerhead 140 is substantially transparent to UV radiation in a predetermined wavelength range and in fluid communication with a purge gas 142. As used in this specification and the appended claims, the term "substantially transparent to UV radiation" means that the window or showerhead does not absorb more than about 10% of the UV light in the predetermined wavelength range, or not more than about 5% of the UV light in the predetermined wavelength range or not more than about 1% of the UV light in the predetermined wavelength range. The purge gas showerhead 140 can be made of any suitable material. For example, the purge gas showerhead 140 of some embodiments comprises quartz.

The purge gas 142 can flow into a purge gas plenum 144, as shown in FIG. 1, and then through the purge gas showerhead 140. The purge gas plenum 144 may be useful to help create a more uniform and consistent flow of purge gas through the purge gas showerhead 140. The purge gas showerhead 140 includes openings 146 through which the purge gas can flow. In some embodiments, the purge gas 142 flows directly into the showerhead 140 without the plenum 144 (not shown), and moves through channels within the showerhead 140 to an opening at a front face of the purge gas showerhead.

A UV source 150 is positioned above the purge gas showerhead 140. The UV source directs UV radiation toward the processing volume through the purge gas showerhead 140. The UV radiation has a wavelength or range of wavelengths sufficient to cause the desired reaction on the substrate surface, or in the process volume. The UV source 150 can be any suitable source capable of generating UV radiation. Suitable examples include, but are not limited to, UV lamps and lasers. In some embodiments, the UV source comprises a plurality of UV lamps arranged in a hexagonal grid formation. The UV source of one or more embodiments is positioned to expose the entire pedestal 120, or the top surface 122 of the entire pedestal 120 including a substrate 60 positioned thereon to UV radiation simultaneously.

A reactive gas injector 130 supplies a reactive gas into the processing volume 125 of the processing chamber 110. The reactive gas injector is in fluid communication with a reactive gas source 132. The reactive gas source can be any suitable source including, but not limited to, a gas cylinder or a precursor ampoule.

The reactive gas injector 130 can deliver a reactive gas to the processing volume 125 through various routes. In the embodiment shown in FIG. 1, the reactive gas injector 130 comprises a deposition showerhead 134 positioned above the pedestal 120. The reactive gas flows through the deposition showerhead 134 into the processing volume 125. The deposition showerhead 134 shown in FIG. 1 is made of a material that is substantially transparent to UV radiation in the predetermined wavelength. However, this is merely one possible type of showerhead. The deposition showerhead 134 can be made of any suitable material which can, including any holes passing through the showerhead, allow the UV radiation from the UV source 150 to enter the processing volume 125.

In the embodiment shown in FIG. 1, the deposition showerhead 134 is positioned a distance from the purge gas showerhead 140. This distance creates a region referred to as the deposition gas plenum 136. The reactive gas injector 130 shown is in fluid communication with this region, the deposition gas plenum 136, above the deposition showerhead 134. Stated differently, the reactive gas injector 130 of some embodiments comprises a deposition showerhead 134 positioned between the purge gas showerhead 140 and the pedestal 120, or processing volume 125. To allow the deposition gases to pass through the deposition showerhead 134 from the deposition gas plenum 136, the deposition showerhead 134 must have a plurality of openings therethrough. These openings can also serve to allow the UV radiation from the UV source 150 to pass through the deposition showerhead 134. Accordingly, the deposition showerhead 134 can be made from any material which may or may not be transparent to the UV radiation. Alternatively, although not shown, the reactive gas injector 130 can be connected to the side of the deposition showerhead 134, where the gas flows through channels within the showerhead. Gases other than the deposition or reactive gas can be in fluid communication with the deposition gas plenum 136. For example, a purge gas source (not shown), which can act as a diluent gas, can also be in fluid communication with the deposition gas plenum 136.

Figure 2:
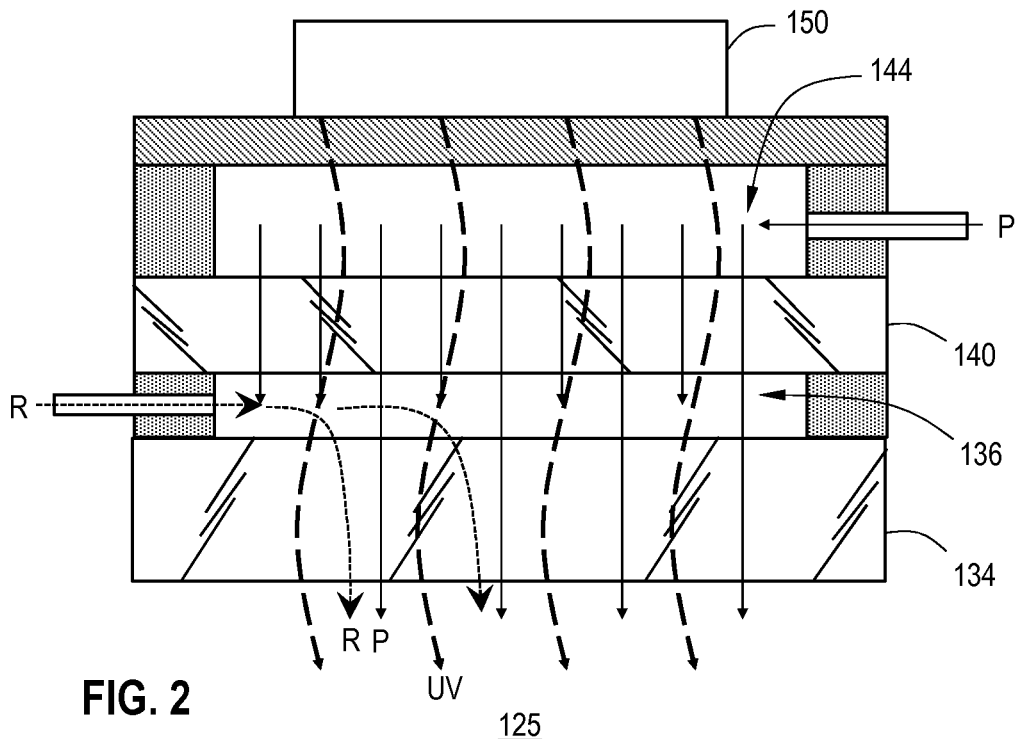
FIG. 2 shows a partial cross-sectional schematic view of a processing chamber and individual gas flows in accordance with one or more embodiment of the invention.

Without being bound by any particular theory of operation, it is believed that the purge gas flowing through the purge gas showerhead 140, along the same direction as the UV radiation, toward the processing volume 125 prevents reactive gases from contacting, and depositing a film on, the purge gas showerhead. Essentially, it is believed that the purge gas P flowing, as shown in FIG. 2, downward toward the processing volume 125 can prevent the reactive gas R from contacting the window (purge gas showerhead 140). From the gas flows shown in FIG. 2, it can be seen that the reactive gas R flowing into the deposition gas plenum 136 is forced downward, away from the purge gas showerhead 140, by the flow of purge gas P. This leaves the window (i.e., the purge gas showerhead 140) clear and unblemished to allow the UV light to pass through. Again, without being bound by any particular theory of operation, it is possible that the purge gas flow may also help prevent the reactive gas R from reacting with or depositing on the deposition gas showerhead 134.

Figure 3:
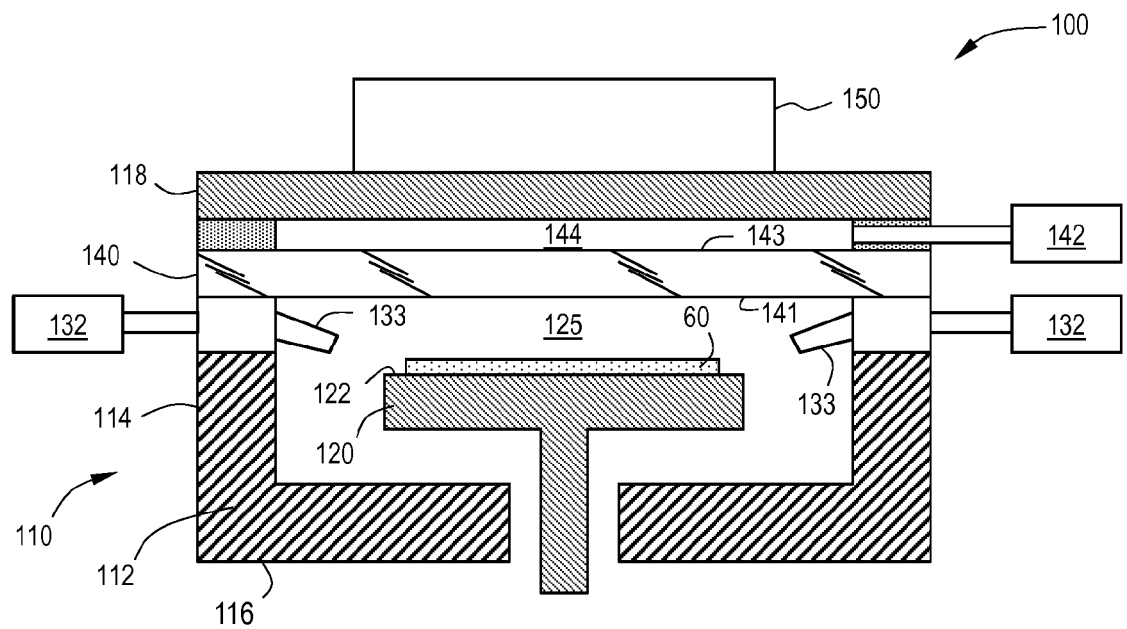
FIG. 3 shows a partial cross-sectional schematic view of a processing chamber in accordance with one or more embodiment of the invention.

FIG. 3 shows another embodiment of the invention without a deposition gas plenum. Here, the reactive gas injector comprises at least one injector port 133, although two injector ports 133 are shown in the Figure. Each of the injector ports 133, independently, can be oriented to provide a gas flow into the processing volume 125 at any angle. In some embodiments, at least one injector port 133 is positioned to provide a flow of gas substantially parallel to the top surface 122 of the pedestal 120. As used in this specification and the appended claims, the term "substantially parallel" using in this respect means that the gas flow is directed within in a range parallel to the purge gas showerhead 140 to an angle sufficient to cause the gas flow to contact at least the outer peripheral edge of the top surface 122 of the pedestal 120.

In some embodiments, as shown in FIG. 3, there are a plurality of injector ports 133. The injector ports 133 are separated into individual groupings, each comprising at least one injector port. The individual groupings comprise at least one first reactive gas port and at least one second reactive gas port. The at least one first reactive gas port, for example, the left gas port 133 in the Figure, is in fluid communication with a first reactive gas, and the second reactive gas port, for example, the right gas port 133 in the Figure, is in fluid communication with a second reactive gas different from the first reactive gas. This configuration allows for at least two reactive gases to be provided into the processing volume 125 either simultaneously (e.g., a CVD type reaction) or sequentially (e.g., an ALD type process).

Figure 4:
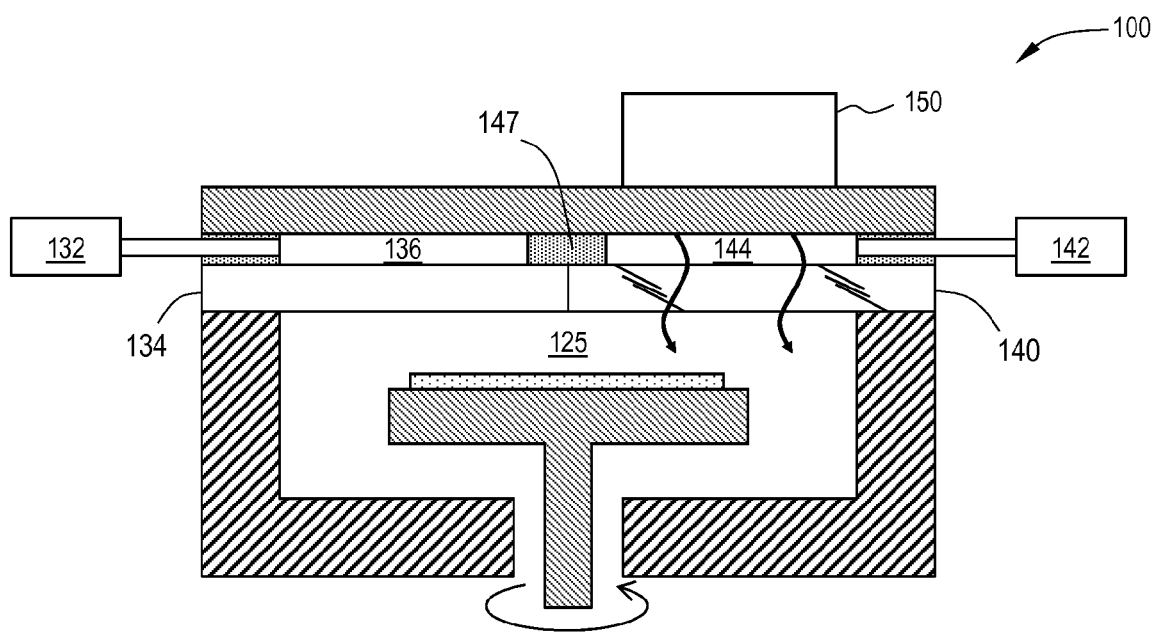
FIG. 4 shows a partial cross-sectional schematic view of a processing chamber in accordance with one or more embodiment of the invention.

FIG. 4 shows another embodiment in which the gas plenum includes at least one wall 147 which separates the gas plenum into a purge gas plenum 144 section and a reactive gas plenum 136 section. Each section can be any suitable shape or size, depending on the process being employed. Here, the purge gas flows from the purge gas source 142 through the purge gas plenum 144 and the purge gas showerhead 140 into the processing volume 125. The deposition gas flows from the deposition gas source 132 through the deposition gas plenum 136 and the deposition gas showerhead 134 into the processing volume 125. The UV source 150 is positioned to direct UV radiation through the purge gas plenum 144 and purge gas showerhead 140 sections only. In this embodiment, the deposition gas showerhead 134 can be made of any suitable material, and can be either opaque, translucent or transparent to UV radiation, or have a combination of transparent and opaque regions or translucent regions. The pedestal 120 rotates so that the substrate 60 rotates beneath the deposition gas showerhead 134 and the purge gas showerhead 140, allowing all parts of the substrate 60 to be exposed to the deposition gas followed by the UV light to complete the reaction.

While FIG. 4 shows two sections, one deposition gas plenum 136 and one purge gas plenum 144, those skilled in the art will understand that there can be more than two sections. For example, there can be three walls 147 (or wall sections) that separate the plenums into three sections. One section can be a first deposition gas plenum in communication with a first deposition gas, the next section can be a second deposition gas plenum in fluid communication with a second deposition gas and the last can be a purge gas plenum to act as a window for the UV source. Thus, a pedestal holding one or more substrate can be rotated to expose each substrate or each portion of a single substrate to the first deposition gas followed by the second deposition gas and then exposure to UV radiation.

Figure 5A:
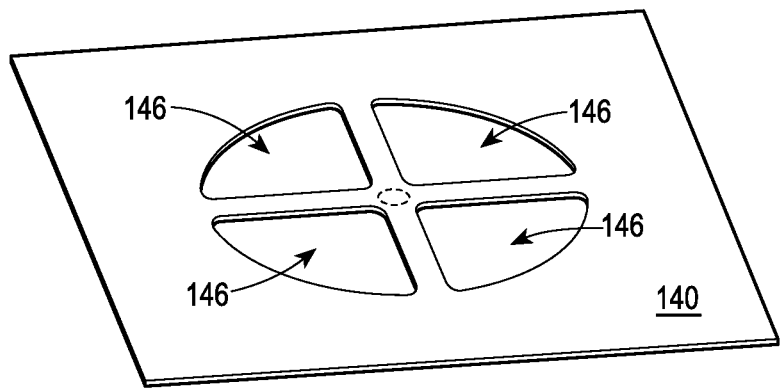
FIGS. 5A through 5C show showerheads in accordance with one or more embodiment of the invention.
Figure 5B:
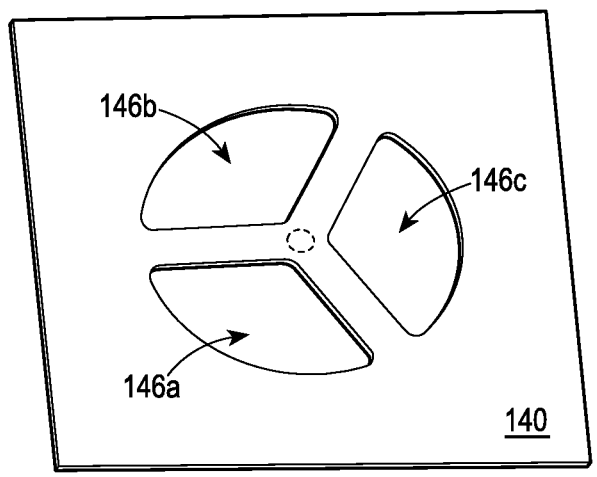
Figure 5C:
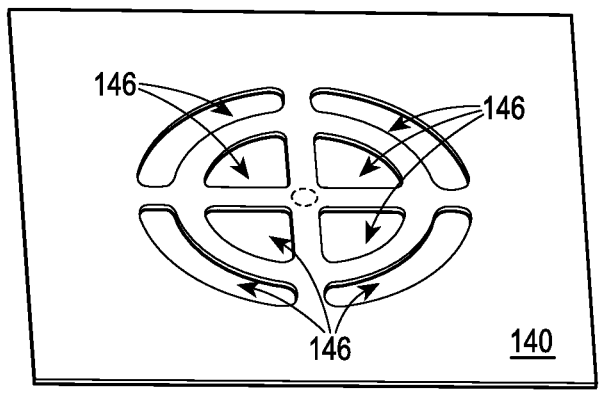

Both the deposition gas showerhead 134 and the purge gas showerhead 140 can be any suitable shape and have any suitably shaped openings therein to allow the respective gases to flow. FIGS. 5A through 5C show three different possible configurations for either of these showerheads. Although the showerheads shown in FIGS. 5A through 5C are shown as purge gas showerheads 140, it will be understood by those skilled in the art that these could also represent deposition gas showerheads. The purge gas showerhead and deposition gas showerheads can be of the same design or different designs. The gas flows can be split to allow a single type of gas to flow through any one or more of the individual openings. For example, referring to FIG. 5B, the gas plenums can be split into three sections, a first reactive gas plenum, a second reactive gas plenum and a purge gas plenum. Each of the openings can be associated with one of the plenums. For example, opening 146*a* may be positioned adjacent the first reactive gas plenum so that the first reactive gas flows through opening 146*a*. The second opening 146*b* may be positioned adjacent the second reactive gas plenum so that the second reactive gas flows through opening 146*b*. The purge gas plenum may be adjacent the third opening 146*c* to allow the purge gas and UV radiation to pass therethrough. Thus, a rotating substrate or pedestal would be exposed to each opening. While a multi-gas plenum was described above, it will be understood that a single gas plenum could be adjacent each of the openings to that the same gas flows through each. Additionally, the size and shape of the openings can vary. While equally sized and spaced openings are shown, there could be a variety of sizes. For example, the combination of the first and second openings can take up ½ of the showerhead with the purge/UV opening occupying the second half.

Additional embodiments of the invention are directed to methods of depositing a film on a substrate. Referring to FIGS. 1 through 4, a substrate 60 is placed into the processing chamber 110 and exposed to at least a first reactive species to deposit a film on the substrate. The reactive species can be any type of reactive species (e.g., a ruthenium organometallic complex) which can chemisorb onto the surface of the substrate. While chemisorption is described, it will be understood that other reaction types can be employed as well. UV radiation is directed toward the deposited film (i.e., the chemisorbed complex) on the substrate 60 through a substantially transparent purge gas showerhead 140 for a predetermined length of time. A purge gas stream is provided through the substantially transparent window. The purge gas stream minimizes the deposition of the reactive species on the purge gas showerhead to minimize obstructing the UV light path. The deposition and exposure to UV steps are repeated until a film of desired thickness is formed. Generally, ALD type reactions are self-limiting, resulting in the deposition of a single monolayer at a time. Thus a single monolayer of the reactive species can be chemisorbed to the substrate and exposed to the UV light. UV exposure can convert the chemisorbed species to another species (e.g., converting a ruthenium organometallic complex to ruthenium metal) which can be used for further chemisorption cycles. By repeating this deposition/UV exposure cycle, a film thicker than one monolayer can be deposited.

The substrate can be exposed to more than one reactive species to deposit the film. For example, two reactive species can be mixed, in a CVD type process creating a species that can chemisorb to the substrate surface. After the CVD deposition, the UV lamp can be turned on to modify the deposited film. In some embodiments, the substrate is subjected to an ALD type process in which the substrate is sequentially exposed to a first reactive gas, a second reactive gas and UV light. Exposure can be time based, meaning that only one of the first reactive gas, second reactive gas, or UV light are occurring at any given time, or spatially based, meaning that the different gases and light are simultaneously provided to the processing volume and portions of the substrate surface move from region to region to be exposed to each. A combination of the time based and spatial ALD processes can also be employed.

In one or more of the ALD type process, the reactive gases flow into the plenum which holds and separates at least two different reactive gases. These two different reactive gases are flowed into separate sections of the processing chamber so Substrates for use with the embodiments of the invention can be any suitable substrate. In detailed embodiments, the substrate is a rigid, discrete, generally planar substrate. As used in this specification and the appended claims, the term "discrete" when referring to a substrate means that the substrate has a fixed dimension. The substrate of specific embodiments is a semiconductor wafer, such as a 200 mm or 300 mm or 450 mm diameter silicon wafer.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus are disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. An apparatus for depositing a film on a substrate, the apparatus comprising:
   a processing chamber having a body including walls, a bottom and a top;
   a rotatable pedestal within the processing chamber to support a substrate, the rotatable pedestal having a top surface defining a lower boundary of a processing volume;
   a reactive gas injector to supply a reactive gas into the processing volume of the processing chamber, the reactive gas injector in fluid communication with a reactive gas source, wherein the reactive gas injector comprises a deposition showerhead that is substantially transparent to UV radiation in a predetermined wavelength range;
   a purge gas showerhead positioned above the pedestal, the purge gas showerhead substantially transparent to UV radiation in a predetermined wavelength range and in fluid communication with a purge gas, wherein the deposition showerhead is positioned at a distance between the purge gas showerhead and the pedestal to form a deposition gas plenum in fluid communication with the purge gas showerhead; and
   a UV source positioned above the purge gas showerhead to direct UV radiation within the predetermined wavelength range through the purge gas showerhead and deposition showerhead toward the processing volume.

2. The apparatus of claim 1, wherein the gas plenum is in fluid communication with one or more of a reactive gas source and a purge gas source.

3. The apparatus of claim 2, wherein the gas plenum comprises at least one wall to separate the plenum into sections, each section in fluid communication with a reactive gas.

4. The apparatus of claim 3, wherein there are at least two different reactive gases.

5. The apparatus of claim 3, wherein the UV source is positioned over one of the sections.

6. The apparatus of claim 3, wherein there is one wall splitting the gas plenum into two sections, each section in fluid communication with a different reactive gas.

7. The apparatus of claim 1, wherein the deposition showerhead comprises quartz.

8. The apparatus of claim 1, wherein the deposition showerhead comprises a quartz plate with a plurality of openings to allow a flow of gas and UV radiation to pass through.

9. The apparatus of claim 1, wherein the reactive gas injector further comprises at least one injector port positioned to provide a flow of gas substantially parallel to the top surface of the pedestal.

10. The apparatus of claim 9, comprising a plurality of injector ports separated into at least one first reactive gas port and at least one second reactive gas port, the at least one first reactive gas port in fluid communication with a first reactive gas and the at least one second reactive gas port in fluid communication with a second reactive gas.

11. The apparatus of claim 1, wherein the UV source is positioned to expose the entire top surface of the pedestal to UV radiation simultaneously.

12. The apparatus of claim 1, wherein the UV source comprises a plurality of lamps.

13. A method of depositing a film on a substrate, the method comprising:
   (a) placing a substrate into a processing chamber;
   (b) exposing the substrate to a reactive species to deposit a film on the substrate, exposing the substrate to the reactive species comprises flowing one or more reactive gas into the processing chamber through a deposition showerhead positioned between the substrate and a substantially transparent purge gas showerhead, wherein a plenum is formed between the deposition showerhead and the substantially transparent purge gas showerhead, the plenum having at least one separate section to contain the reactive gas and the purge gas flowing from the substantially transparent purge gas showerhead;
   (c) directing UV radiation toward the deposited film on the substrate through the substantially transparent purge gas showerhead for a predetermined time;
   (d) providing a purge gas stream through the substantially transparent purge gas showerhead toward the substrate to prevent deposition of the reactive species on the substantially transparent purge gas showerhead; and
   (e) repeating (b) through (d) to deposit a film of desired thickness.

14. The method of claim 13, wherein the film is deposited by one or more of a CVD and an ALD process.

15. The method of claim 13, wherein the plenum holds and separates at least two different reactive gases which are flowed into separate sections of the processing chamber so that there is substantially no mixing of the reactive gases and the method further comprises rotating the substrate within the processing chamber.

16. The method of claim 13, wherein exposing the substrate to the reactive species comprises flowing one or more reactive gas into the processing chamber through a gas injector in a side of the processing chamber.

* * * * *